(12) United States Patent
Lee et al.

(10) Patent No.: US 12,237,208 B2
(45) Date of Patent: Feb. 25, 2025

(54) SEMICONDUCTOR DEVICE INCLUDING DEVICE ISOLATION LAYER WITH MULTIPLE PATTERNS

(71) Applicant: Samsung Electronics Co., Ltd., Suwon-si (KR)

(72) Inventors: Hyunchul Lee, Hwaseong-si (KR); Ki-Jeong Kim, Seongnam-si (KR); Hwan Lim, Hwaseong-si (KR); Hyun-Sil Hong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 342 days.

(21) Appl. No.: 17/668,452

(22) Filed: Feb. 10, 2022

(65) Prior Publication Data

US 2023/0013061 A1  Jan. 19, 2023

(30) Foreign Application Priority Data

Jul. 16, 2021  (KR) .................. 10-2021-0093388

(51) Int. Cl.
| | |
|---|---|
| *H01L 21/76* | (2006.01) |
| *H01L 21/02* | (2006.01) |
| *H01L 21/762* | (2006.01) |
| *H01L 29/423* | (2006.01) |
| *H10B 12/00* | (2023.01) |
| *H01L 21/311* | (2006.01) |

(52) U.S. Cl.
CPC .. *H01L 21/76224* (2013.01); *H01L 21/02164* (2013.01); *H01L 21/0217* (2013.01); *H01L 29/4236* (2013.01); *H10B 12/488* (2023.02); *H01L 21/311* (2013.01)

(58) Field of Classification Search
CPC .... H10B 12/315; H10B 12/34; H10B 13/488; H01L 21/76224; H01L 21/02164; H01L 21/0217
See application file for complete search history.

(56) References Cited

U.S. PATENT DOCUMENTS

| | | | |
|---|---|---|---|
| 7,473,647 B2 | 1/2009 | Lee et al. | |
| 9,082,850 B2 | 7/2015 | Kim et al. | |
| 9,305,825 B2 | 4/2016 | Youn et al. | |
| 9,818,648 B2 | 11/2017 | Chao et al. | |

(Continued)

FOREIGN PATENT DOCUMENTS

| | | | | | |
|---|---|---|---|---|---|
| CN | 111354728 A | * | 6/2020 | ......... | H01L 29/4236 |
| KR | 20210048694 A | * | 5/2021 | ......... | H01L 29/4236 |

*Primary Examiner* — Ida M Soward
(74) *Attorney, Agent, or Firm* — Harness, Dickey & Pierce, P.L.C.

(57) ABSTRACT

A semiconductor device includes a substrate having one or more inner surfaces defining trenches that define an active pattern of the substrate, the trenches including a first trench and a second trench which have different widths, a device isolation layer on the substrate such that the device isolation layer at least partially fills the trenches, and a word line intersecting the active pattern. The device isolation layer includes a first isolation pattern covering a portion of the second trench, a second isolation pattern on the first isolation pattern and covering a remaining portion of the second trench, and a filling pattern filling the first trench under the word line. A top surface of the second isolation pattern is located at a higher level than a top surface of the filling pattern.

18 Claims, 15 Drawing Sheets

(56) References Cited

U.S. PATENT DOCUMENTS

| | | | |
|---|---|---|---|
| 10,037,890 B2 | 7/2018 | Basavalingappa et al. | |
| 10,879,398 B2 | 12/2020 | Lee et al. | |
| 2014/0061743 A1* | 3/2014 | Kim | H10B 12/053 257/296 |
| 2015/0111360 A1* | 4/2015 | Kim | H10B 12/315 438/381 |
| 2015/0214230 A1* | 7/2015 | Kim | H10B 12/315 257/773 |
| 2018/0175045 A1* | 6/2018 | Lee | H01L 23/528 |
| 2020/0203215 A1* | 6/2020 | Jang | H01L 21/76229 |
| 2020/0287024 A1 | 9/2020 | Dewey et al. | |
| 2020/0395356 A1 | 12/2020 | Shu et al. | |
| 2021/0118991 A1* | 4/2021 | Ahn | H01L 29/7851 |
| 2021/0126098 A1* | 4/2021 | Lee | H10B 12/34 |
| 2022/0028860 A1* | 1/2022 | Choi | H10B 12/315 |

* cited by examiner

SEMICONDUCTOR DEVICE INCLUDING DEVICE ISOLATION LAYER WITH MULTIPLE PATTERNS

CROSS-REFERENCE TO RELATED APPLICATION

This U.S. non-provisional patent application claims priority under 35 U.S.C. § 119 to Korean Patent Application No. 10-2021-0093388, filed on Jul. 16, 2021, in the Korean Intellectual Property Office, the disclosure of which is hereby incorporated by reference in its entirety.

BACKGROUND

The present inventive concepts relate to a semiconductor device, and more particularly, to a semiconductor device with improved electrical characteristics.

Semiconductor devices are widely used in the electronic industry because of their small-sized, multi-functional and/or low-cost characteristics. Data storage devices (e.g., semiconductor memory devices) among the semiconductor devices may store logical data. The data storage devices have been highly integrated with the development of the electronic industry. Thus, linewidths of components constituting the data storage devices have been reduced.

In addition, high reliability of the data storage devices may be required along with the high integration density of the data storage devices. However, an increase in integration density of the data storage devices may cause deterioration in reliability of the data storage devices. Thus, techniques for improving the reliability of the data storage devices have been studied.

SUMMARY

Example embodiments of the inventive concepts may provide a semiconductor device with improved electrical characteristics.

In some example embodiments of the inventive concepts, a semiconductor device may include a substrate having one or more inner surfaces defining trenches that define an active pattern of the substrate, the trenches including a first trench and a second trench which have different widths, a device isolation layer on the substrate such that the device isolation layer at least partially fills the trenches, and a word line intersecting the active pattern. The device isolation layer may include a first isolation pattern covering a portion of the second trench, a second isolation pattern on the first isolation pattern and covering a remaining portion of the second trench, and a filling pattern filling the first trench under the word line. A top surface of the second isolation pattern may be located at a higher level than a top surface of the filling pattern.

In some example embodiments of the inventive concepts, a semiconductor device may include a substrate having one or more inner surfaces defining trenches that define an active pattern of the substrate, the trenches including a first trench and a second trench which have different widths, and the substrate having one or more additional inner surfaces that define a third trench penetrating an upper portion of the active pattern, a device isolation layer on the substrate such that the device isolation layer at least partially fills the first trench and the second trench, the device isolation layer including one or more device isolation layer inner surfaces that define a fourth trench penetrating an upper portion of the device isolation layer, a word line in the third trench and the fourth trench, and a bit line intersecting the word line. The device isolation layer may include a first isolation pattern covering a portion of the second trench, a second isolation pattern on the first isolation pattern and covering a remaining portion of the second trench, and a filling pattern filling the first trench under the word line. A top surface of the filling pattern may be located at a lower level than a top surface of the first isolation pattern.

In some example embodiments of the inventive concepts, a semiconductor device may include a substrate having one or more inner surfaces defining trenches that define an active pattern, the trenches including a first trench and a second trench, the active pattern including a first source/drain region and a pair of second source/drain regions, the pair of second source/drain regions spaced apart from each other with the first source/drain region between the pair of second source/drain regions, a device isolation layer on the substrate such that the device isolation layer at least partially fills the first trench and the second trench, a word line in the substrate and intersecting the active pattern, a bit line on the substrate and intersecting the word line, the bit line connected to the first source/drain region, a contact on the substrate and connected to the second source/drain region, a landing pad on the contact and electrically connected to the contact, a bottom electrode on the landing pad, a top electrode on the bottom electrode, and a dielectric layer between the bottom electrode and the top electrode. The device isolation layer may include a first isolation pattern covering a portion of the second trench, a second isolation pattern on the first isolation pattern and covering a remaining portion of the second trench, and a filling pattern filling the first trench under the word line. A top surface of the second isolation pattern may be located at a higher level than a top surface of the filling pattern. The substrate may have one or more additional inner surfaces that define a third trench penetrating an upper portion of the active pattern, and the device isolation layer may have one or more device isolation layer inner surfaces that define a fourth trench penetrating an upper portion of the device isolation layer. A bottom surface of the third trench may be located at a higher level than a bottom surface of the fourth trench.

BRIEF DESCRIPTION OF THE DRAWINGS

The inventive concepts will become more apparent in view of the attached drawings and accompanying detailed description.

DETAILED DESCRIPTION

Figure 1:
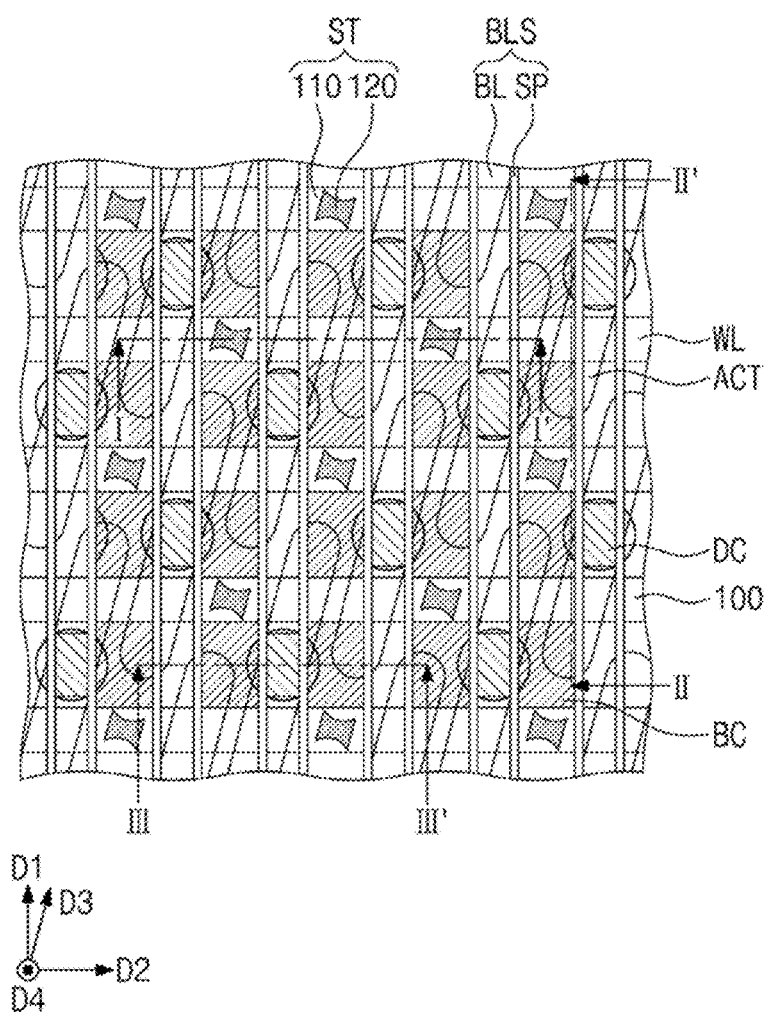
FIG. 1 is a plan view illustrating a semiconductor device according to some example embodiments of the inventive concepts.

Hereinafter, some example embodiments of the inventive concepts will be described in detail with reference to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements and/or "identical" to other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 2:
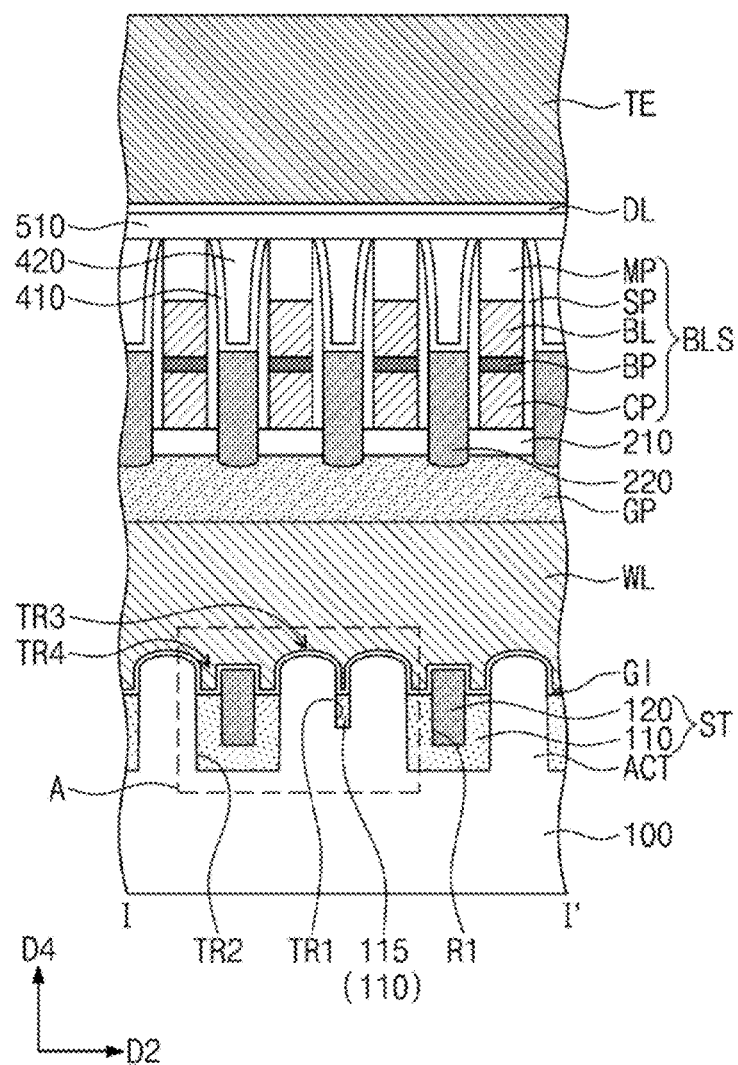
FIGS. 2, 3 and 4 are cross-sectional views taken along lines I-I', II-II' and III-III' of FIG. 1, respectively, to illustrate a semiconductor device according to some example embodiments of the inventive concepts.
Figure 3:
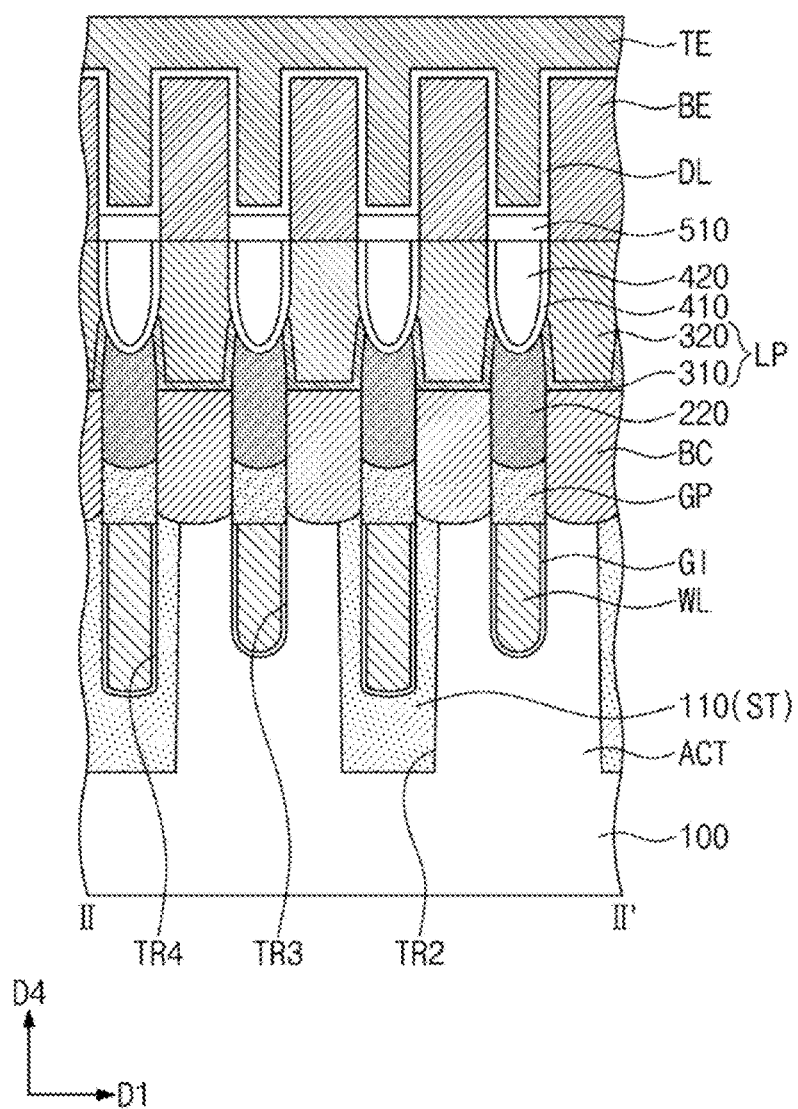
Figure 4:
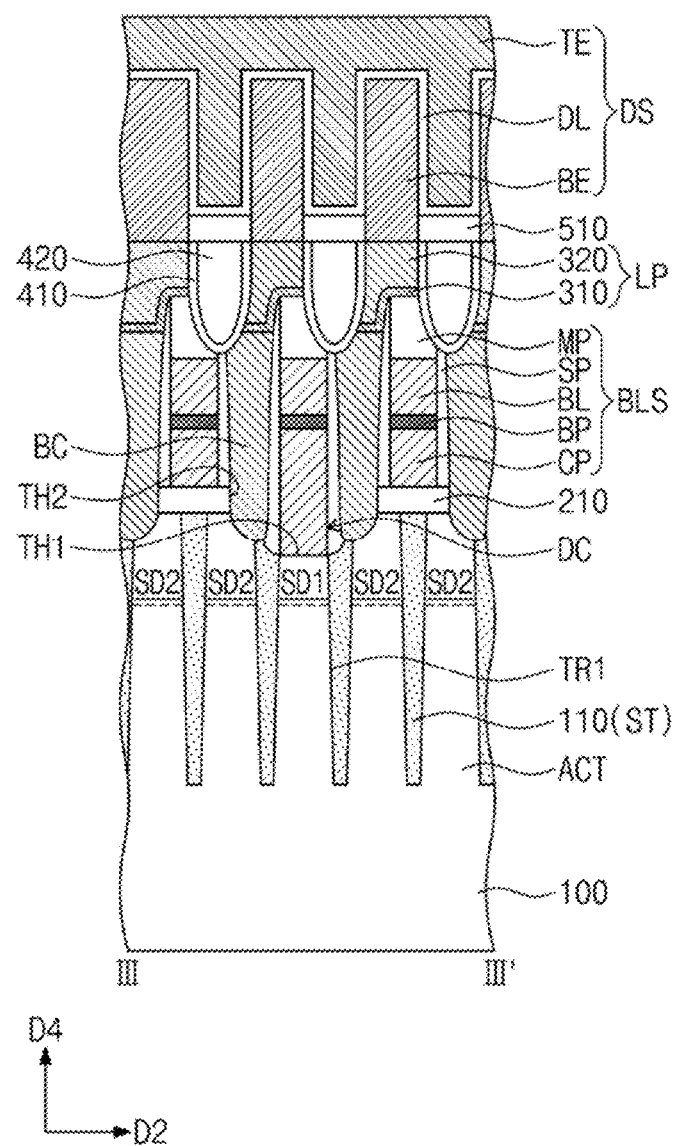
Figure 5:
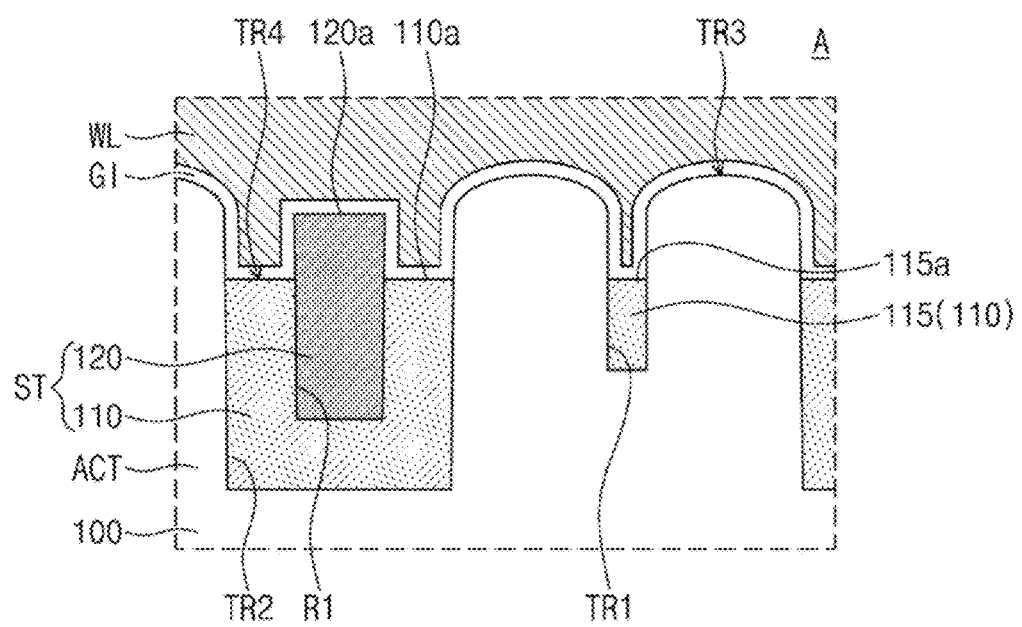
FIG. 5 is an enlarged view of a portion 'A' of FIG. 2.

FIG. 1 is a plan view illustrating a semiconductor device according to some example embodiments of the inventive concepts. FIGS. 2, 3 and 4 are cross-sectional views taken along lines I-I', II-II' and III-III' of FIG. 1, respectively, to illustrate a semiconductor device according to some example embodiments of the inventive concepts. FIG. 5 is an enlarged view of a portion 'A' of FIG. 2.

Referring to FIGS. 1, 2, 3, 4 and 5, a substrate 100 having active patterns ACT may be provided. A device isolation layer ST may be on the substrate 100 such that the device isolation layer ST may at least partially (e.g., partially or completely) fill first and second trenches TR1 and TR2 defining the active patterns ACT of the substrate 100. For example, the substrate 100 may be a semiconductor substrate including at least one of silicon, germanium, or silicon-germanium. The device isolation layer ST may include first isolation patterns 110 and second isolation patterns 120. The second isolation patterns 120 may be provided on the first isolation patterns 110. As shown in at least FIG. 2, the substrate 100 may include one or more inner surfaces that collectively define the first and second trenches TR1 and TR2 and thus define the active patterns ACT of the substrate 100.

Each of the first isolation patterns 110 may cover a portion of each of the second trenches TR2 (e.g., at least partially fill each of the second trenches TR2, at least partially cover the one or more inner surfaces of the substrate 100 defining the second trenches TR2, etc.). The first isolation pattern 110 may conformally cover an inner side surface and a bottom surface of the second trench TR2, where the inner side surface and the bottom surface of the second trench TR2 are understood to be inner surfaces of the substrate 100 that define the second trench TR2. The first isolation pattern 110 may have a recess region R1 defining an empty region formed in the second trench TR2, such that the first isolation pattern 110 may partially fill the second trench TR2 based on not filling the recess region R1. Each of the second isolation patterns 120 may fill a remaining portion of each of the second trenches TR2. The second isolation pattern 120 may be on the first isolation patterns 110 and completely fill the inside of the recess region R1, where the recess region R1 may be understood to be the remaining portion of a second trench TR2 that is not filled by the first isolation pattern 110. The first isolation pattern 110 may be disposed between the active pattern ACT and the second isolation pattern 120. The first isolation pattern 110 may be in direct contact with the active pattern ACT. The second isolation pattern 120 may be disposed in the second trench TR2 and may be disposed under a word line WL to be described later. The second isolation pattern 120 may be spaced apart from the active pattern ACT. The first isolation pattern 110 and the second isolation pattern 120 may include different materials (e.g., may have different total material compositions). The first isolation pattern 110 may include, for example, silicon oxide. The second isolation pattern 120 may include, for example, silicon nitride.

The active patterns ACT may be formed by patterning an upper portion of the substrate 100. The active patterns ACT may be two-dimensionally arranged in a first direction D1 and a second direction D2. The first direction D1 may be parallel to a top surface of the substrate 100. The second direction D2 may be parallel to the top surface of the substrate 100 and may intersect the first direction D1. The active patterns ACT may be spaced apart from each other in a third direction D3. The third direction D3 may be parallel to the top surface of the substrate 100 and may intersect the first and second directions D1 and D2. Each of the active patterns ACT may have a long axis extending in the third direction D3. A width of each of the active patterns ACT may decrease as a level in a direction perpendicular to the top surface of the substrate 100 (e.g., a fourth direction D4) increases. In other words, the width of each of the active patterns ACT may decrease as a height or level from a bottom surface of the substrate 100 increases.

The device isolation layer ST may be provided on the substrate 100. The device isolation layer ST may fill the first and second trenches TR1 and TR2. The first and second trenches TR1 and TR2 may be provided between the active patterns ACT to define the active patterns ACT. The first trench TR1 may be defined between a pair of the active patterns ACT adjacent to each other in the second direction D2. The second trench TR2 may be defined between a pair of the active patterns ACT adjacent to each other in the third direction D3. A distance between the pair of active patterns ACT adjacent to each other in the second direction D2 may be less than a distance between the pair of active patterns ACT adjacent to each other in the third direction D3. Thus, the bottom surface of the second trench TR2 may be located at a lower level than a bottom surface of the first trench TR1. A width of the first trench TR1 may be less than a width of the second trench TR2. As shown in at least FIG. 2, a width of a bottom surface of the first trench TR1 may be less (e.g., smaller) than a width of a bottom surface of the second trench TR2. In the present specification, the term 'level' may mean a vertical height measured from the bottom surface of the substrate 100. In the present specification, the term 'width' may mean a width (or length) measured in a direction parallel to the top surface of the substrate 100.

An upper portion of each of the active patterns ACT may include a first source/drain region SD1 and a pair of second source/drain regions SD2. The pair of second source/drain regions SD2 may be spaced apart from each other (e.g., may be isolated from direct contact with each other). The first source/drain region SD1 may be located between the pair of second source/drain regions SD2. The second source/drain region SD2, the first source/drain region SD1 and the second source/drain region SD2 may be sequentially arranged in the third direction D3 when viewed in a plan view. The upper portion of each of the active patterns ACT may include a pair of channel regions. The channel region may be disposed between the first source/drain region SD1 and the second source/drain region SD2 when viewed in a plan view. The channel region may be located under a third trench TR3 to be described later and may be adjacent to a lower portion of a word line WL to be described later.

Third trenches TR3 may be provided in the substrate 100 to penetrate upper portions of the active patterns ACT. Fourth trenches TR4 may be provided to penetrate an upper portion of the device isolation layer ST. The substrate 100 may include the third trenches TR3, and the device isolation layer ST may include the fourth trenches TR4. For example, as shown in at least FIG. 3, the substrate 100 may have one or more inner surfaces (which may be one or more additional inner surfaces in relation to the one or more inner surfaces of the substrate that define the first and second trenches TR1 and TR2) that define a third trench TR3 that may penetrate an upper portion of an active pattern ACT. For example, as shown in at least FIG. 3, the device isolation layer ST may have one or more device isolation layer inner surfaces (e.g., one or more inner surfaces of the first isolation pattern 110) that define a fourth trench TR4 that may penetrate an upper portion of the device isolation layer ST (e.g., an upper portion of the first isolation pattern 110). The third and fourth trenches TR3 and TR4 may be disposed under a word line WL to be described later and may define a region in which the word line WL will be formed. The third trench TR3 may extend downward from a top surface of the active pattern ACT toward the bottom surface of the substrate 100 while penetrating the upper portion of the active pattern ACT. A bottom surface of the third trench TR3 may be located at a higher level than the bottom surfaces of the first and second trenches TR1 and TR2. The fourth trench TR4 may extend downward from a top surface of the device isolation layer ST toward the bottom surface of the substrate 100 while penetrating the upper portion of the device isolation layer ST. A bottom surface of the fourth trench TR4 may be located at a higher level than the bottom surfaces of the first and second trenches TR1 and TR2. For example, the bottom surface of the third trench TR3 may be located at a higher level than the bottom surface of the fourth trench TR4. The bottom surface of the third trench TR3 and the bottom surface of the fourth trench TR4 may have curved surfaces which are convex downward. For example, as shown in at least FIG. 3, a curvature of the bottom surface of the third trench TR3 may be greater than a curvature of the bottom surface of the fourth trench TR4. In other words, the bottom surface of the fourth trench TR4 may be flatter than the bottom surface of the third trench TR3. For example, a width of the fourth trench TR4 may be equal or substantially equal or similar to a width of the third trench TR3. Particularly, the maximum width of the fourth trench TR4 may be equal or substantially equal or similar to the maximum width of the third trench TR3.

As illustrated in FIGS. 2 and 5, a top surface of the active pattern ACT between the first trench TR1 and the second trench TR2 which are adjacent to each other may correspond to the bottom surface of the third trench TR3. A top surface of the device isolation layer ST disposed under the word line WL may be located at a lower level than the top surface of the active pattern ACT disposed under the word line WL. More particularly, top surfaces 110a and 120a of the first and second isolation patterns 110 and 120 disposed under the word line WL may be located at a lower level than the top surfaces of the active patterns ACT disposed under the word line WL. The top surface 120a of the second isolation pattern 120 disposed under the word line WL may be located at a higher level (e.g., may be further from the bottom surface of the substrate 100 in the fourth direction D4) than the top surface 110a of the first isolation pattern 110 disposed under the word line WL. In the present specification, a first isolation pattern 110 disposed between two active patterns ACT which are disposed between the second isolation patterns 120 adjacent to each other in the second direction D2 and are adjacent to each other in the second direction D2 may be referred to as a filling pattern 115. The filling pattern 115 may at least partially fill the first trench TR1 (e.g., partially or completely fill the first trench TR1) disposed under the word line WL. A top surface 115a of the filling pattern 115 may be located at the same or substantially the same level as the top surface 110a of the first isolation pattern 110 disposed under the word line WL. The top surface 120a of the second isolation pattern 120 may be located at a higher level than the top surface 115a of the filling pattern 115. In some example embodiments, the filling pattern 115 and the second isolation pattern 120 may include different materials (e.g., may have different total material compositions).

Referring again to FIGS. 1 to 5, the word lines WL may be provided on the substrate 100. The word lines WL may intersect (e.g., extend in a different direction as and/or at least partially overlap in the fourth direction D4) the active patterns ACT and the device isolation layer ST. In the present specification, the word line WL may be referred to as a gate electrode. Each of the word lines WL may be provided in (e.g., may partially or completely fill) the third and fourth trenches TR3 and TR4. For example, the third trench TR3 and the fourth trench TR4 may define a region in which the word lines WL are formed. For example, a third trench TR3 and a fourth trench TR4 may define a region in which a word line WL is formed and/or is located. Accordingly, in some example embodiments, a word line WL may be understood to be located in (e.g., within) a third trench TR3 and a fourth trench TR4. The word lines WL may thus be understood, in some example embodiments, to be at least partially (e.g., partially or entirely) in (e.g., partially or completely within a volume spaced defined by outermost surfaces of) the substrate 100. The word lines WL may be spaced apart from each other in the first direction D1, and each of the word lines WL may extend in the second direction D2. A pair of the word lines WL may be provided on the pair of channel regions of the active pattern ACT. The word line WL may be disposed between the first source/drain region SD1 and the second source/drain region SD2 when viewed in a plan view. For example, a top surface of the word line WL may be lower than a top surface of the first source/drain region SD1 and a top surface of the second source/drain region SD2. The word line WL may include at least one of, for example, a conductive metal nitride or a metal material. For example, the conductive metal nitride may include at least one of titanium nitride or tantalum nitride. For example, the metal material may include at least one of titanium, tantalum, tungsten, copper, or aluminum.

As shown in at least FIGS. 2-3, a gate dielectric layer GI may be disposed between the word line WL and the active pattern ACT and between the word line WL and the device isolation layer ST (e.g., between the word line WL and the second isolation pattern 120). As illustrated in FIGS. 2 and 5, the gate dielectric layer GI may be disposed between the word line WL and the second isolation pattern 120 and between the word line WL and the filling pattern 115. The gate dielectric layer GI may conformally cover the second isolation pattern 120 exposed by the first isolation pattern 110. The gate dielectric layer GI may cover the top surface 120a of the second isolation pattern 120 and the top surface of the filling pattern 115. The gate dielectric layer GI may include at least one of, for example, silicon oxide, silicon nitride, silicon oxynitride, or a high-k dielectric material. For example, the high-k dielectric material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Referring again to FIGS. 1 to 5, a gate capping layer GP may be provided on the word line WL. The gate capping layer GP may cover the top surface of the word line WL. A top surface of the gate capping layer GP may be coplanar or substantially coplanar with the top surface of the first source/drain region SD1 and the top surface of the second source/drain region SD2. The gate capping layer GP may include at least one of, for example, silicon oxide, silicon nitride, or silicon oxynitride.

An interlayer insulating layer 210 may be provided on the substrate 100. The interlayer insulating layer 210 may have first holes TH1 exposing the first source/drain regions SD1 of the active patterns ACT. The interlayer insulating layer 210 may include at least one of, for example, silicon oxide, silicon nitride, or silicon oxynitride. In some example embodiments, the interlayer insulating layer 210 may have a structure including at least one or more stacked layers.

Bit line structures BLS may be provided on the interlayer insulating layer 210. The bit line structures BLS may extend in the first direction D1 and may be spaced apart from each other in the second direction D2. The bit line structures BLS may intersect the word lines WL when viewed in a plan view. Each of the bit line structures BLS may include: a conductive pattern CP, a barrier pattern BP, a bit line BL and a mask pattern MP, which are sequentially stacked; and a pair of spacers SP. The conductive pattern CP, the barrier pattern BP, the bit line BL and the mask pattern MP may vertically overlap (e.g., overlap in the fourth direction D4) with each other. As shown, a bit line BL may intersect a word line WL. As shown, a bit line BL may be on the substrate 100. The pair of spacers SP may cover side surfaces of the conductive pattern CP, side surfaces of the barrier pattern BP, side surfaces of the bit line BL, and side surfaces of the mask pattern MP.

The conductive pattern CP may include a bit line contact portion DC which is disposed in the first hole TH1 so as to be connected to the first source/drain region SD1. For example, the bit line contact portion DC may penetrate the interlayer insulating layer 210 to extend toward the bottom surface of the substrate 100. The bit line contact portion DC may be in direct contact with the first source/drain region SD1. Thus, the bit line BL may be connected (e.g., electrically connected) to the first source/drain region SD1 through the conductive pattern CP. The conductive pattern CP may be vertically spaced apart from the second source/drain regions SD2 of the active patterns ACT by the interlayer insulating layer 210. The conductive pattern CP may include a doped semiconductor material (e.g., doped silicon and/or doped germanium). In the present specification, it may be understood that when a component is referred to as being "electrically connected or coupled" to another component, it may be directly connected or coupled to the other component or at least one intervening component may be present.

The barrier pattern BP may be disposed between the conductive pattern CP and the bit line BL. The barrier pattern BP may reduce, inhibit, or prevent a metal material in the bit line BL from being diffused into the conductive pattern CP. For example, the barrier pattern BP may include a conductive metal nitride (e.g., titanium nitride and/or tantalum nitride).

The bit line BL may be disposed between the barrier pattern BP and the mask pattern MP. The bit line BL may be electrically connected to the first source/drain region SD1 through the barrier pattern BP and the conductive pattern CP. The bit lines BL may extend to intersect the word lines WL when viewed in a plan view. For example, the bit line BL may include a metal material (e.g., titanium, tantalum, tungsten, copper, and/or aluminum). Each of the mask patterns MP may have a line shape extending in the first direction D1. The mask pattern MP may include at least one of, for example, silicon nitride or silicon oxynitride.

A width of the spacer SP may decrease as a level from the bottom surface of the substrate 100 increases. The spacers SP may include at least one of, for example, silicon oxide, silicon nitride, or silicon oxynitride. Even though not shown in the drawings, each of the spacers SP may include a plurality of layers. For example, each of the spacers SP may include a first spacer which directly covers the side surface of the conductive pattern CP, the side surface of the barrier pattern BP, the side surface of the bit line BL, and the side surface of the mask pattern MP. Each of the spacers SP may also include a second spacer and a third spacer which are sequentially stacked on the first spacer. The second spacer may be disposed between the first spacer and the third spacer and may include an insulating material of which a dielectric constant is lower than those of the first spacer and the third spacer. For some examples, the first spacer and the third spacer may include silicon nitride, and the second spacer may include silicon oxide. In some example embodiments, the second spacer may be an air spacer formed of air.

A plurality of insulating fences 220 may be provided on the gate capping layer GP. Each of the insulating fences 220 may penetrate the interlayer insulating layer 210 to extend to an upper portion of the gate capping layer GP. The insulating fences 220 may be two-dimensionally arranged in the first and second directions D1 and D2 when viewed in a plan view. The insulating fences 220 and the bit line structures BLS may be alternately arranged in the second direction D2. The insulating fences 220 may include a silicon nitride.

Contacts BC may be provided on the substrate 100. The contacts BC may penetrate the interlayer insulating layer 210 so as to be connected to the second source/drain regions SD2, respectively. Each of the contacts BC may fill a second hole TH2 formed by partially etching an upper portion of the second source/drain region SD2. The contact BC may be electrically connected to the second source/drain region SD2. The contact BC may be in direct contact with the second source/drain region SD2 exposed through the second hole TH2. The contact BC may be in contact with a side surface of the spacer SP and the top surface of the device isolation layer ST. Due to the spacer SP, the contact BC may be spaced apart from the bit line BL adjacent thereto. The contacts BC may be two-dimensionally arranged in the first and second directions D1 and D2 when viewed in a plan view. The contacts BC and the bit line structures BLS may be alternately arranged in the second direction D2. The contacts BC and the insulating fences 220 may be alternately arranged in the first direction D1. For example, the contact BC may include a doped semiconductor material (e.g., doped silicon and/or doped germanium).

Landing pads LP may be provided on and connected to (e.g., in direct contact with, electrically connected with, etc.) the contacts BC, respectively. The landing pads LP may be electrically connected to the second source/drain regions SD2 through the contacts BC, respectively. An upper portion of the landing pad LP may be misaligned with the contact BC. More particularly, the upper portion of the landing pad LP may be laterally offset from a center of the contact BC. Each of the landing pads LP may include a diffusion barrier pattern 310 and a landing pattern 320, which are sequentially stacked on the contact BC. The diffusion barrier pattern 310 may be disposed between the contact BC and the landing pattern 320. For example, the landing pads LP may include a metal material. The diffusion barrier pattern 310 may include a metal nitride (e.g., titanium nitride, tantalum nitride, and/or tungsten nitride). The landing pattern 320 may include a metal material (e.g., titanium, tantalum, tungsten, copper, and/or aluminum).

A first insulating pattern 410 and a second insulating pattern 420 may be provided on the mask pattern MP. The first insulating pattern 410 and the second insulating pattern 420 may define planar shapes of the landing pads LP. The first insulating pattern 410 may be disposed between the second insulating pattern 420 and the landing pad LP. For example, the second insulating pattern 420 may be provided in an inner space surrounded by the first insulating pattern 410. Adjacent landing pads LP may be separated from each other by the first insulating pattern 410 and the second insulating pattern 420. A top end of the first insulating pattern 410 and a top surface of the second insulating pattern 420 may be coplanar or substantially coplanar with a top surface of the landing pad LP. The first insulating pattern 410 may include at least one of, for example, tetraethyl orthosilicate (TEOS) or a high-density plasma (HDP) oxide. The second insulating pattern 420 may include at least one of, for example, silicon oxide, silicon nitride, or silicon oxynitride.

Data storing elements DS may be provided on the landing pads LP. More particularly, the data storing elements DS may include bottom electrodes BE, a top electrode TE, and a dielectric layer DL. The bottom electrodes BE may be provided on and connected to (e.g., in direct contact with, electrically connected to, etc.) the landing pads LP, respectively. The top electrode TE may be disposed on (e.g., indirectly on) the bottom electrodes BE. The dielectric layer DL may be disposed between the bottom electrodes BE and the top electrode TE. The bottom electrodes BE, the dielectric layer DL and the top electrode TE may constitute capacitors for storing data. An etch stop layer 510 may be on the first insulating pattern 410 and the second insulating layer 420. The etch stop layer 510 may cover a top surface of the first insulating pattern 410 and the second insulating layer 420. The etch stop layer 510 may be interposed between adjacent bottom electrodes BE. The etch stop layer 510 may include an insulating material (e.g., silicon oxide, silicon nitride, silicon oxynitride, silicon boron nitride, or silicon carbon nitride). In some example embodiments, the etch stop layer 510 may be a single layer or a multiple layer.

In some example embodiments, each of the bottom electrodes BE may have a solid pillar shape. However, example embodiments of the inventive concepts are not limited thereto. In some example embodiments, each of the bottom electrodes BE may have a hollow cylinder shape having a closed bottom end. The bottom electrodes BE may be arranged in a zigzag form in the first direction D1 or the second direction D2 to constitute a honeycomb form, when viewed in a plan view. Alternatively, the bottom electrodes BE may be arranged in a matrix form in the first and second directions D1 and D2.

The bottom electrodes BE may include at least one of, for example, poly-silicon doped with dopants, a metal (e.g., tungsten or titanium), or a metal nitride (e.g., titanium nitride). The dielectric layer DL may include, for example, a high-k dielectric material (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate). The top electrode TE may include at least one of, for example, doped silicon, Ru, RuO, Pt, PtO, Ir, IrO, SrRuO (SRO), (Ba,Sr)RuO (BSRO), CaRuO (CRO), BaRuO, La(Sr,Co)O, Ti, TiN, W, WN, Ta, TaN, TiAlN, TiSiN, TaAlN, or TaSiN.

According to some example embodiments of the inventive concepts, the third trenches TR3 and the fourth trenches TR4 may be formed uniformly and symmetrically, and the word lines WL provided in the third and fourth trenches TR3 and TR4 may also be formed uniformly and symmetrically. In addition, according to some example embodiments of the inventive concepts, the top surface 115a of the filling pattern 115 between the active patterns ACT adjacent to each other may be lower than the top surface 120a of the second isolation pattern 120 and the top surfaces of the adjacent active patterns ACT. Thus, a portion of the word line WL may be disposed between the adjacent active patterns ACT. As a result, the word line WL may efficiently surround the channel region, and thus electrical characteristics of a transistor may be improved.

Figure 6:
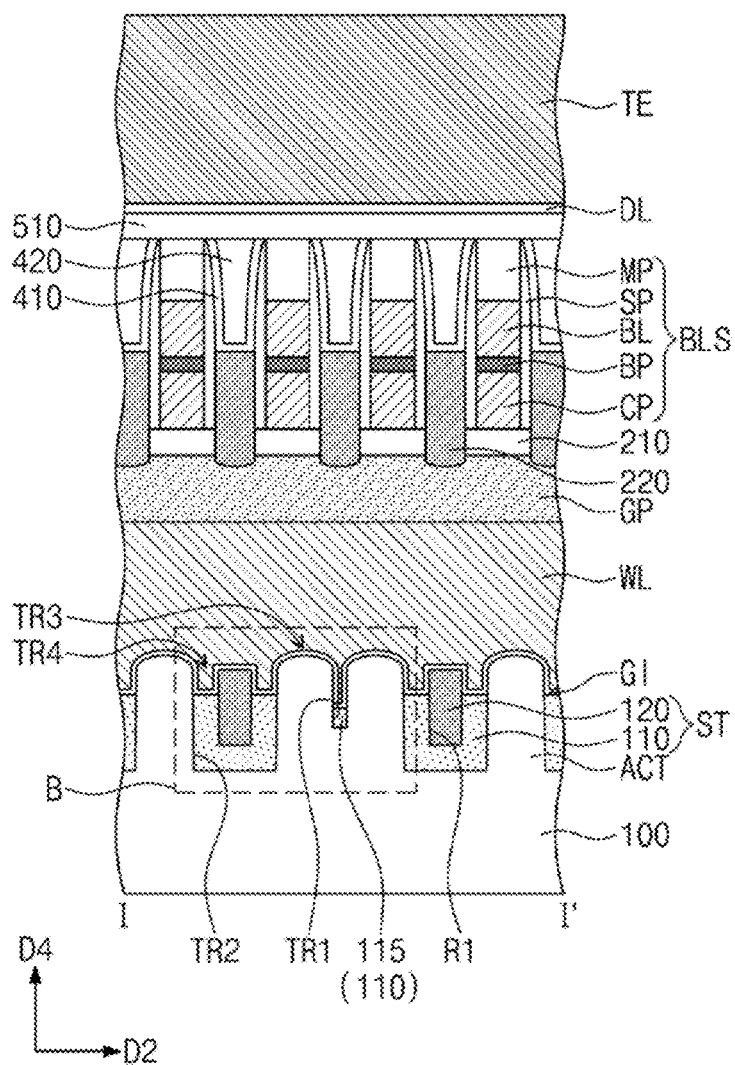
FIG. 6 is a cross-sectional view taken along the line I-I' of FIG. 1 to illustrate a semiconductor device according to some example embodiments of the inventive concepts.
Figure 7:
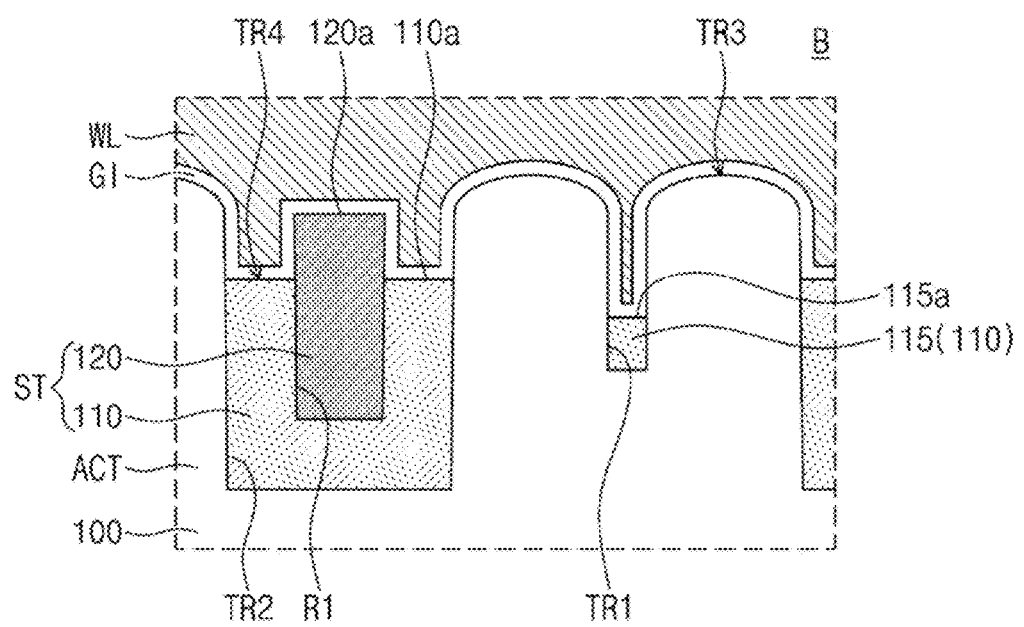
FIG. 7 is an enlarged view of a portion 'B' of FIG. 6.

FIG. 6 is a cross-sectional view taken along the line I-I' of FIG. 1 to illustrate a semiconductor device according to some example embodiments of the inventive concepts. FIG. 7 is an enlarged view of a portion 'B' of FIG. 6. Hereinafter, the descriptions to the same components and features as described above will be omitted for the purpose of ease and convenience in explanation.

Referring to FIGS. 1, 6 and 7, the top surfaces 110a and 120a of the first and second isolation patterns 110 and 120 disposed under the word line WL may be located at a lower level than the top surfaces of the active patterns ACT disposed under the word line WL. The top surface 120a of the second isolation pattern 120 may be located at a higher level than the top surface 110a of the first isolation pattern 110 disposed under the word line WL. The top surface 115a of the filling pattern 115 may be located at a lower level than the top surface 110a of the first isolation pattern 110 disposed under the word line WL. The top surface 120a of the second isolation pattern 120 may be located at a higher level than the top surface 115a of the filling pattern 115.

Figure 8:
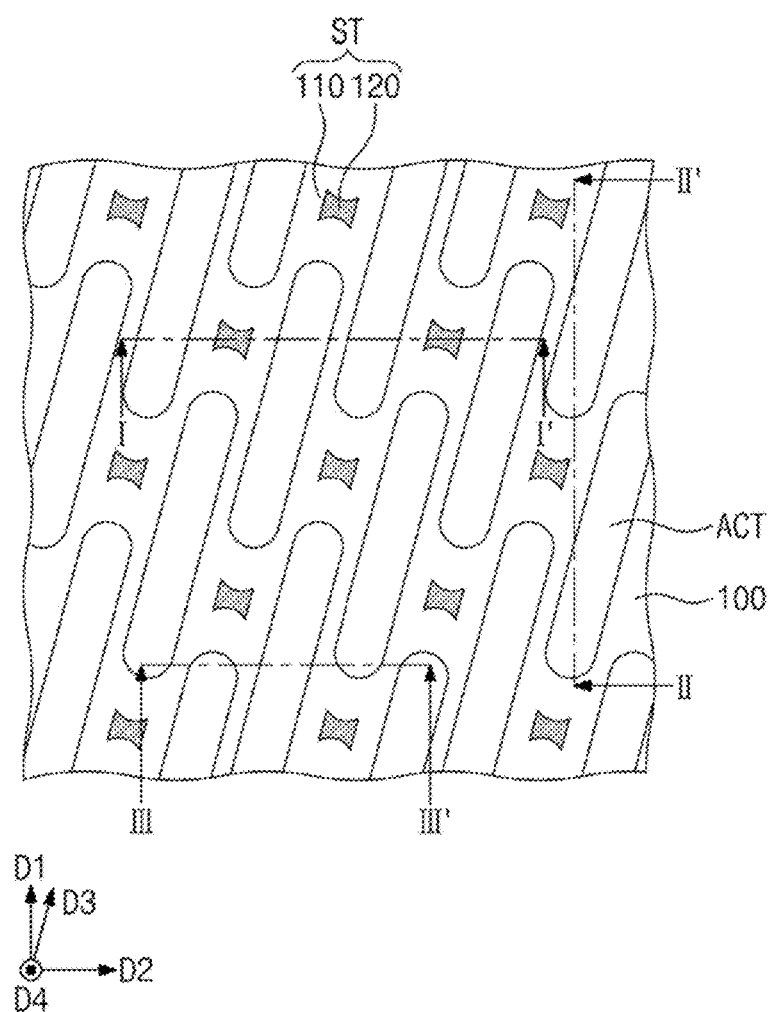
FIG. 8 is a plan view illustrating a method of manufacturing a semiconductor device according to some example embodiments of the inventive concepts.
Figure 9:
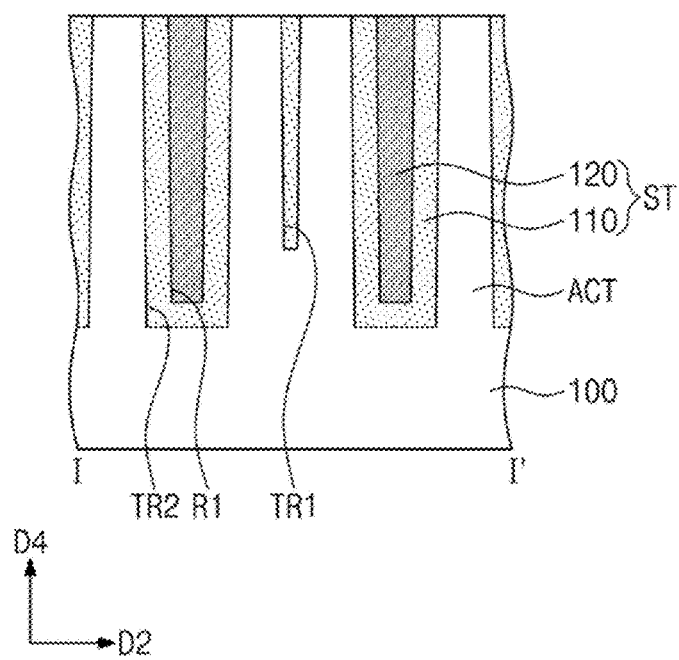
FIGS. 9 and 12 are cross-sectional views taken along a line I-I' of FIG. 8 to illustrate a method of manufacturing a semiconductor device according to some example embodiments of the inventive concepts.
Figure 10:
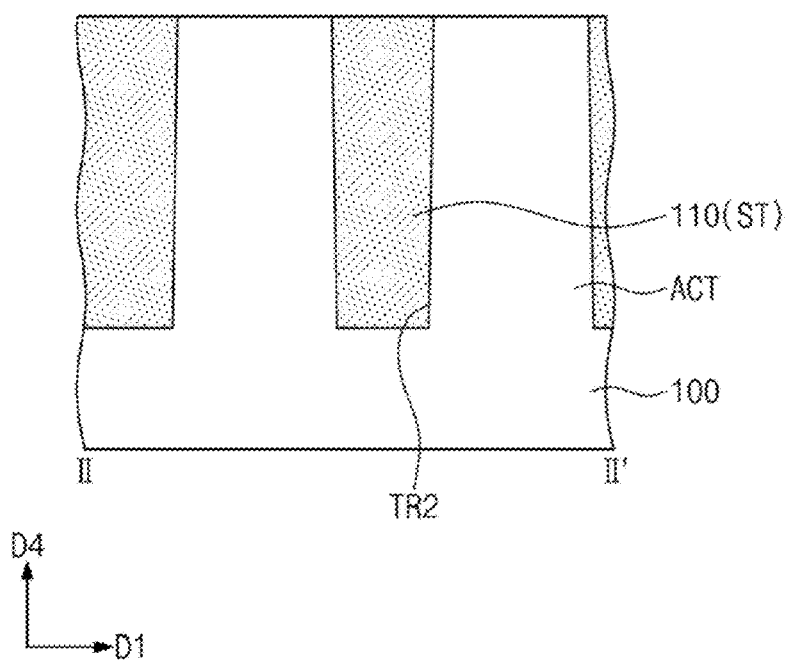
FIGS. 10 and 13 are cross-sectional views taken along a line II-II' of FIG. 8 to illustrate a method of manufacturing a semiconductor device according to some example embodiments of the inventive concepts.
Figure 11:
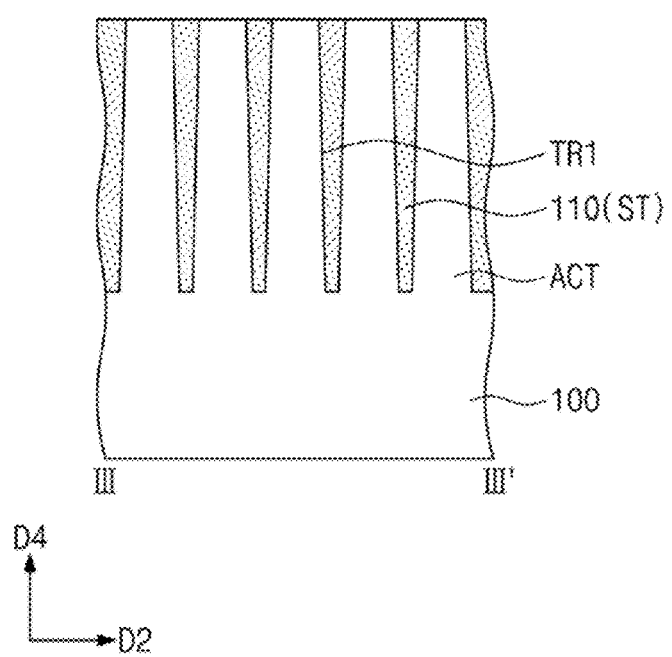
FIGS. 11 and 14 are cross-sectional views taken along a line II-II' of FIG. 8 to illustrate a method of manufacturing a semiconductor device according to some example embodiments of the inventive concepts.
Figure 12:
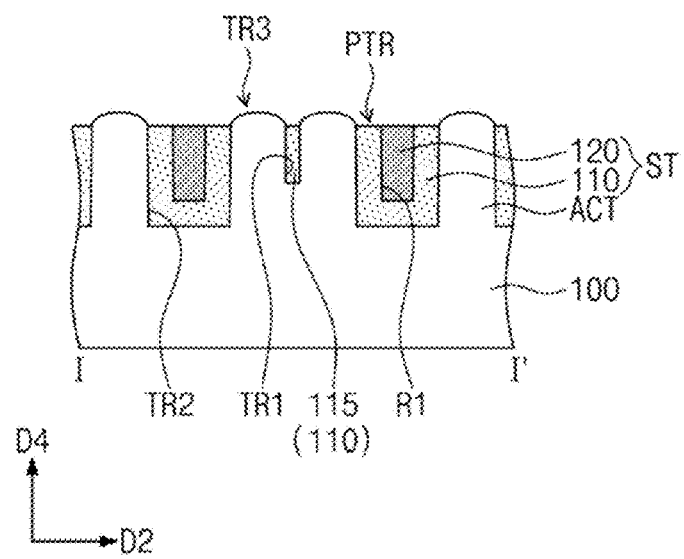
Figure 13:
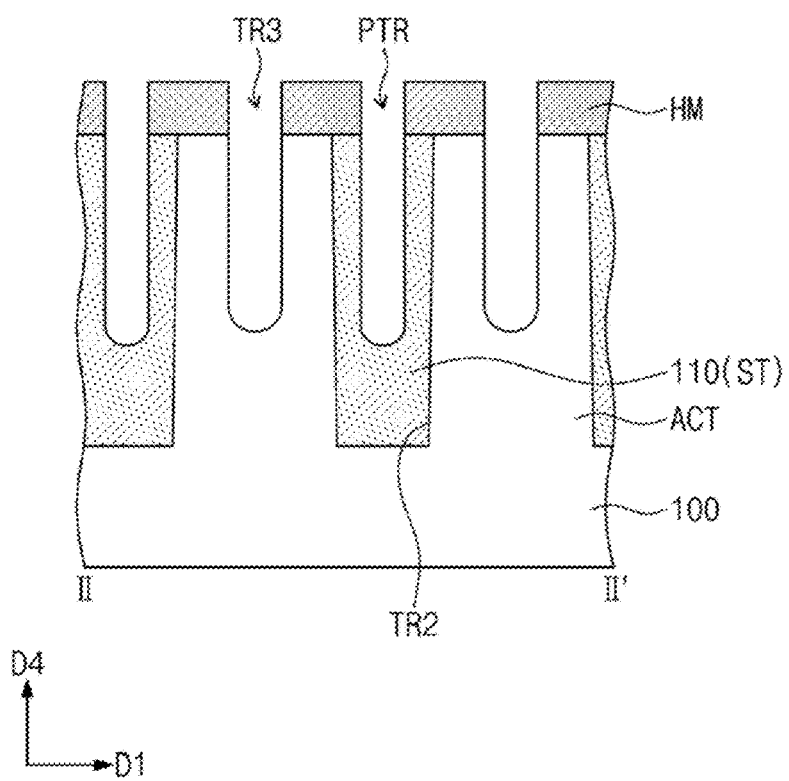
Figure 14:
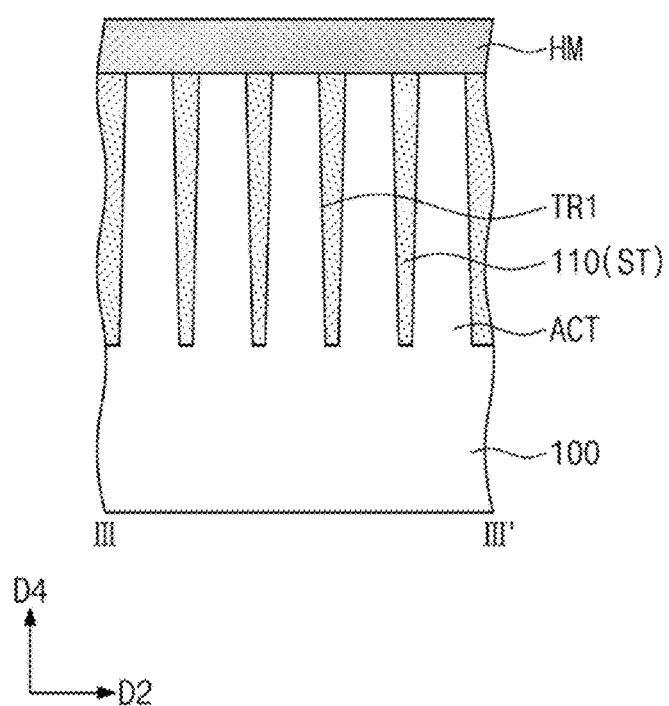
Figure 15:
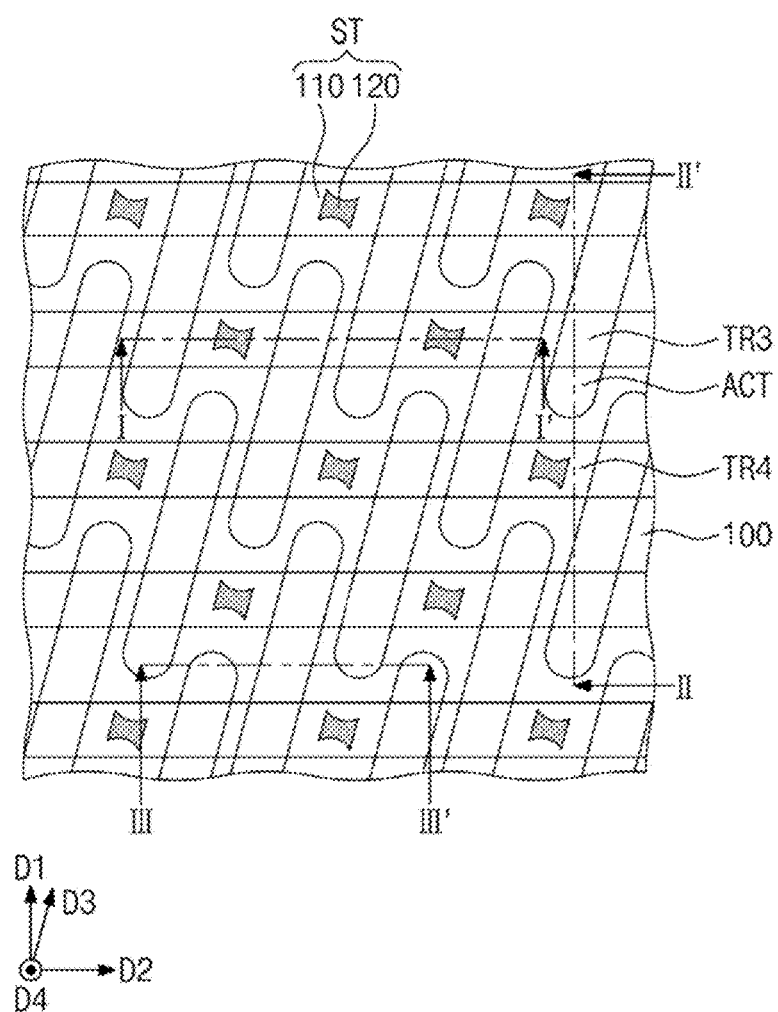
FIG. 15 is a plan view illustrating a method of manufacturing a semiconductor device according to some example embodiments of the inventive concepts.
Figure 16:
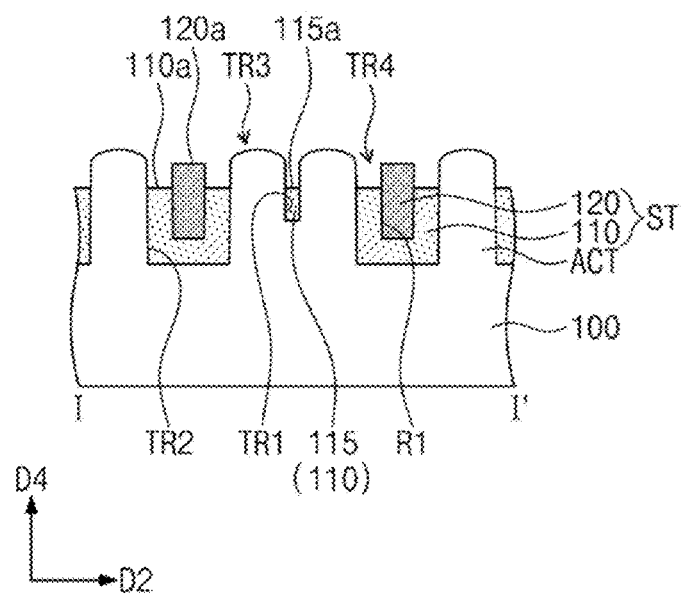
FIG. 16 is a cross-sectional view taken along a line I-I' of FIG. 15 to illustrate a method of manufacturing a semiconductor device according to some example embodiments of the inventive concepts.
Figure 17:
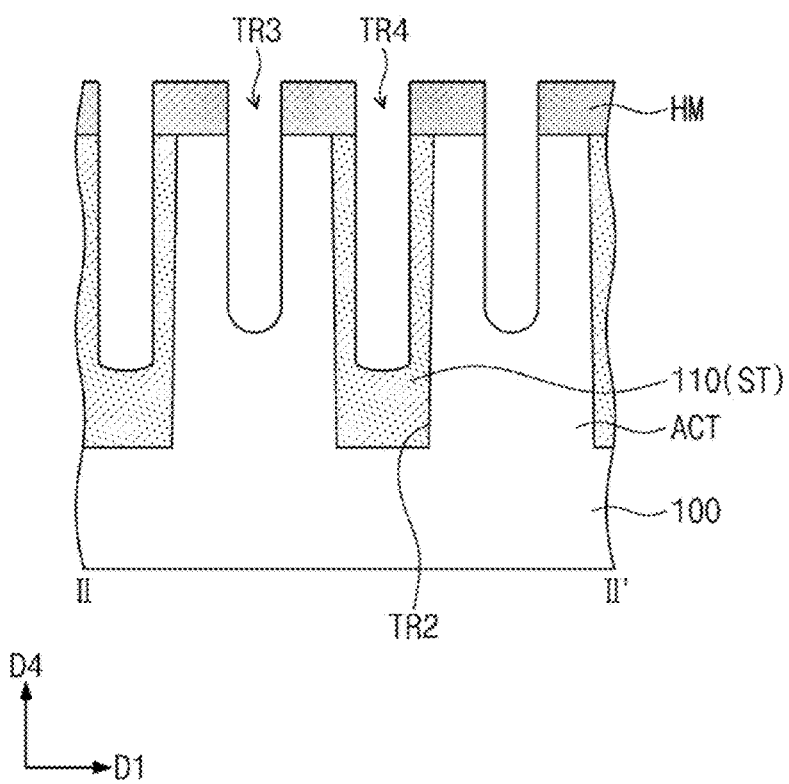
FIG. 17 is a cross-sectional view taken along a line II-II' of FIG. 15 to illustrate a method of manufacturing a semiconductor device according to some example embodiments of the inventive concepts.
Figure 18:
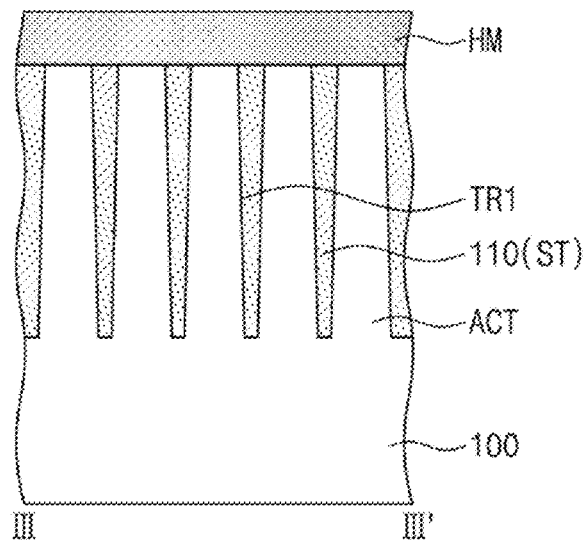
FIG. 18 is a cross-sectional view taken along a line III-III' of FIG. 15 to illustrate a method of manufacturing a semiconductor device according to some example embodiments of the inventive concepts.
Figure 18:

FIG. 8 is a plan view illustrating a method of manufacturing a semiconductor device according to some example embodiments of the inventive concepts. FIGS. 9 and 12 are cross-sectional views taken along a line I-I' of FIG. 8 to illustrate a method of manufacturing a semiconductor device according to some example embodiments of the inventive concepts. FIGS. 10 and 13 are cross-sectional views taken along a line II-II' of FIG. 8 to illustrate a method of manufacturing a semiconductor device according to some example embodiments of the inventive concepts. FIGS. 11 and 14 are cross-sectional views taken along a line III-III' of FIG. 8 to illustrate a method of manufacturing a semiconductor device according to some example embodiments of the inventive concepts. FIG. 15 is a plan view illustrating a method of manufacturing a semiconductor device according to some example embodiments of the inventive concepts. FIG. 16 is a cross-sectional view taken along a line I-I' of FIG. 15 to illustrate a method of manufacturing a semiconductor device according to some example embodiments of the inventive concepts. FIG. 17 is a cross-sectional view taken along a line II-II' of FIG. 15 to illustrate a method of manufacturing a semiconductor device according to some example embodiments of the inventive concepts. FIG. 18 is a cross-sectional view taken along a line III-III' of FIG. 15 to illustrate a method of manufacturing a semiconductor device according to some example embodiments of the inventive concepts.

Referring to FIGS. 8, 9, 10 and 11, a substrate 100 may be provided. An upper portion of the substrate 100 may be patterned to form first and second trenches TR1 and TR2 defining active patterns ACT. The first and second trenches TR1 and TR2 may be formed between the active patterns ACT. The first trench TR1 may be formed between a pair of the active patterns ACT adjacent to each other in the second direction D2. The second trench TR2 may be formed between a pair of the active patterns ACT adjacent to each other in the third direction D3.

A device isolation layer ST may be formed to fill the first and second trenches TR1 and TR2. The device isolation layer ST may completely fill the first and second trenches TR1 and TR2 and may cover the active patterns ACT. The formation of the device isolation layer ST may include forming first isolation patterns 110, and forming second isolation patterns 120.

Each of the first isolation patterns 110 may be formed to cover a portion of each of the second trenches TR2. The first isolation pattern 110 may be formed to conformally cover an inner side surface and a bottom surface of the second trench TR2. Each of the first isolation patterns 110 may fill a portion of each of the second trenches TR2 and may define a recess region R1 in each of the second trenches TR2. The recess region R1 may be an empty region formed in each of the second trenches TR2.

Each of the second isolation patterns 120 may be formed to fill a remaining portion of each of the second trenches TR2. The second isolation pattern 120 may completely fill the inside of the recess region R1. The first isolation pattern 110 may be disposed between the active pattern ACT and the second isolation pattern 120.

A planarization process may be performed on the device isolation layer ST until top surfaces of the active patterns ACT are exposed. Due to the planarization process, a top surface of the first isolation pattern 110 and a top surface of the second isolation pattern 120 may be coplanar or substantially coplanar with the top surfaces of the active patterns ACT. Thus, the first isolation patterns 110 and the second isolation patterns 120 may define the active patterns ACT and may be referred to as the device isolation layer ST.

Referring to FIGS. 12, 13 and 14, a first etching process may be performed on the substrate 100. By the first etching process, the active patterns ACT may be etched to form third trenches TR3, and the device isolation layer ST may be etched to form preliminary trenches PTR. The third trench TR3 and the preliminary trench PTR may be formed to be shallower than the first trench TR1. In some example embodiments, a bottom surface of the third trench TR3 may be located at a higher level than a bottom surface of the preliminary trench PTR. In some example embodiments, a width of the preliminary trench PTR may be greater than a width of the third trench TR3.

The formation of the third trenches TR3 and the preliminary trenches PTR may include forming a hard mask pattern HM on the substrate 100, and etching the active patterns ACT and the device isolation layer ST by using the hard mask pattern HM as an etch mask. The hard mask pattern HM may include openings defining regions in which word lines WL will be formed. The openings of the hard mask pattern HM may extend in the second direction D2 when viewed in a plan view. The openings of the hard mask pattern HM may be spaced apart from each other in the first direction D1. The hard mask pattern HM may include a different material from that of the first isolation pattern 110. For example, the hard mask pattern HM may include silicon nitride (SixNy). For some examples, the hard mask pattern HM may include the same material as the second isolation pattern 120.

The active patterns ACT, the first isolation pattern 110 and the second isolation pattern 120 may be etched by the first etching process. In some example embodiments, a portion of the hard mask pattern HM may be etched by the first etching process. In some example embodiments, an etch selectivity of the first isolation pattern 110 and the active pattern ACT may be adjusted in such a way that an etch rate of the first isolation pattern 110 is higher than an etch rate of the active pattern ACT. However, example embodiments of the inventive concepts are not limited thereto. In some example embodiments, etch rates of the components ACT, 110, 120 and HM may be variously adjusted by adjusting conditions of the first etching process.

As illustrated in FIG. 12, in the first etching process, the etch selectivity of the first isolation pattern 110 and the active pattern ACT may be adjusted in such a way that a top surface of the device isolation layer ST is located at a lower level than a top surface of the active pattern ACT between the first and second trenches TR1 and TR2 adjacent to each other. A top surface of the first isolation pattern 110 may be coplanar or substantially coplanar with a top surface of the second isolation pattern 120. The first isolation pattern 110 disposed between two active patterns ACT which are adjacent to each other in the second direction D2 and are disposed between the second isolation patterns 120 adjacent to each other in the second direction D2 may be etched by the first etching process, and thus a filling pattern 115 may be formed. A top surface of the filling pattern 115 may be located at the same or substantially the same level as the top surface of the first isolation pattern 110 and the top surface of the second isolation pattern 120. In the first etching process, the etch selectivity of the first isolation pattern 110 and the active pattern ACT may be adjusted in such a way that the top surface of the filling pattern 115 is located at a lower level than the top surface of the active pattern ACT between the first and second trenches TR1 and TR2 adjacent to each other.

Referring to FIGS. 15, 16, 17 and 18, a second etching process may be performed on the substrate 100. The device isolation layer ST may be etched by the second etching process, thereby forming fourth trenches TR4. The fourth trench TR4 may be formed to be shallower than the first trench TR1. In some example embodiments, a bottom surface of the fourth trench TR4 may be located at a lower level than the bottom surface of the third trench TR3. In some example embodiments, a width of the fourth trench TR4 may be equal or substantially equal or similar to a width of the third trench TR3. However, example embodiments of the inventive concepts are not limited thereto. The width of the fourth trench TR4 may be variously adjusted by adjusting conditions of the second etching process. The formation of the fourth trenches TR4 may include etching the first isolation patterns 110 using the hard mask pattern HM as an etch mask.

The second etching process may be performed by, for example, a wet etching process or a dry etching process. For example, the second etching process may be a dry etching process using an etching gas. The second etching process may include providing the substrate 100 into a vacuum chamber, injecting the etching gas into the vacuum chamber, and providing RF power to form plasma on the substrate 100. For example, the etching gas may include at least one of $C_xF_y$, $O_2$, Ar, or He. The second etching process may be performed by applying relatively low RF power. For example, the RF power may range from 10 W to 500 W. The second etching process may be performed at a temperature equal to or higher than a room temperature and under a relatively low pressure. For example, the temperature of the second etching process may range from 30° C. to 100° C.

In some example embodiments, the first isolation pattern 110 may be selectively etched depending on an etch selectivity of the first isolation pattern 110, the second isolation pattern 120 and the active pattern ACT. For example, in some example embodiments, the etch selectivity of the first isolation pattern 110 with respect to the second isolation pattern 120 and the active pattern ACT may be adjusted in such a way that an etch rate of the first isolation pattern 110 is higher than etch rates of the active pattern ACT and the second isolation pattern 120. However, example embodiments of the inventive concepts are not limited thereto. The etch rates of the first and second isolation patterns 110, 120 and the active patterns ACT may be variously adjusted by adjusting conditions of the second etching process.

As illustrated in FIG. 16, in the second etching process, the etch selectivity of the first isolation pattern 110 with respect to the second isolation pattern 120 and the active pattern ACT may be adjusted in such a way that a top surface 110a of the first isolation pattern 110 is located at a lower level than a top surface 120a of the second isolation pattern 120. The filling pattern 115 may be etched by the second etching process, and thus a top surface 115a of the filling pattern 115 may be located at the same or substantially the same level as the top surface 110a of the first isolation pattern 110. Thus, the top surface 115a of the filling pattern 115 may be located at a lower level than the top surface 120a of the second isolation pattern 120.

The second etching process may selectively etch the first isolation pattern 110 and the filling pattern 115. The active patterns ACT, the second isolation pattern 120 and the hard mask pattern HM may be hardly etched by the second etching process. In other words, the second etching process may not etch the active patterns ACT, the second isolation pattern 120, and the hard mask pattern HM or may etch very small amounts thereof. Thus, the second isolation pattern 120 may protrude above the top surface 110a of the first isolation pattern 110.

According to some example embodiments of the inventive concepts, the hard mask pattern HM including a different material from that of the first isolation pattern 110 may be used as the etch mask, and thus the etch selectivity may be improved in the etching process of the active pattern ACT and the device isolation layer ST. More particularly, the etch rate (or an etched degree) of the first isolation pattern 110 may be increased. Thus, a step difference between a center and an edge of a pattern formed by the etching process may be reduced, inhibited, or prevented, and a line and edge roughness (LER) characteristic may be improved. As a result, a word line WL to be formed in a subsequent process may be formed uniformly and symmetrically. In addition, the etch selectivity may be freely adjusted since the hard mask pattern HM is used as the etch mask, and thus the filling pattern 115 between the active patterns ACT adjacent to each other may be efficiently etched. As a result, a portion of the word line WL may be disposed between the active patterns ACT adjacent to each other. Accordingly, the word line WL may efficiently surround a channel region, and thus electrical characteristics of a transistor may be improved.

Figure 19:
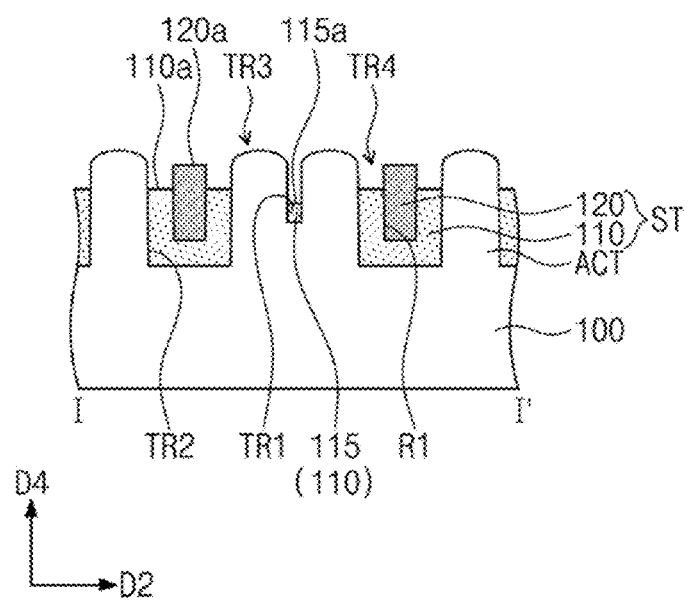
FIG. 19 is a cross-sectional view taken along the line I-I' of FIG. 15 to illustrate a method of manufacturing a semiconductor device according to some example embodiments of the inventive concepts.

FIG. 19 is a cross-sectional view taken along the line I-I' of FIG. 15 to illustrate a method of manufacturing a semiconductor device according to some example embodiments of the inventive concepts. Hereinafter, the descriptions to the same features as described above will be omitted for the purpose of ease and convenience in explanation.

Referring to FIGS. 15, 17, 18 and 19, a second etching process may be performed on the substrate 100. In the second etching process, an etch selectivity of the filling pattern 115 with respect to the second isolation pattern 120 and the active pattern ACT may be adjusted in such a way that a top surface 115a of the filling pattern 115 is located at a lower level than the top surface 110a of the first isolation pattern 110 and the top surface 120a of the second isolation pattern 120. Except for this feature, previous processes of the present embodiments may be the same or substantially the same as described above, and subsequent processes of the present embodiments may be the same or substantially the same as described below.

Referring again to FIGS. 1, 2, 3, 4 and 5, a gate dielectric layer GI, a word line WL and a gate capping layer GP may be sequentially formed in the third and fourth trenches TR3 and TR4 arranged in the second direction D2. In detail, the gate dielectric layer GI may be conformally formed in the third trenches TR3 and the fourth trenches TR4. The word line WL may be formed on the gate dielectric layer GI. The formation of the word line WL may include filling a remaining portion of the third trench TR3 and a remaining portion of the fourth trench TR4 with a conductive material. The conductive material may include at least one of, for example, a conductive metal nitride or a metal material. The gate capping layer GP may be formed on the word line WL. The formation of the gate capping layer GP may include recessing the gate dielectric layer GI and the word line WL, and forming the gate capping layer GP on the recessed word line WL. The hard mask pattern HM may be removed. A top surface of the gate capping layer GP may be coplanar or substantially coplanar with a top surface of the active pattern ACT.

An ion implantation process may be performed on the active patterns ACT to form a first source/drain region SD1 and a pair of second source/drain regions SD2 in an upper portion of each of the active patterns ACT. The pair of second source/drain regions SD2 may be spaced apart from each other in the third direction D3 with the first source/drain region SD1 interposed therebetween when viewed in a plan view. For example, the first and second source/drain regions SD1 and SD2 may be doped with the same dopants. A channel region may be defined in the active pattern ACT located under the word line WL. The channel region may be disposed between the first source/drain region SD1 and the second source/drain region SD2 when viewed in a plan view. The word line WL may be provided on a top surface and both side surfaces of the channel region.

An interlayer insulating layer 210 may be formed on an entire top surface of the substrate 100. For example, the interlayer insulating layer 210 may be patterned to form first holes TH1 exposing the first source/drain regions SD1 of the active patterns ACT, respectively. When the first hole TH1 is formed, an upper portion of the first source/drain region SD1 may be recessed. When the first hole TH1 is formed, an upper portion of the device isolation layer ST around the first source/drain region SD1 may also be recessed.

Conductive patterns CP, barrier patterns BP, bit lines BL and mask patterns MP may be formed on the interlayer insulating layer 210. The formation of the conductive patterns CP, the barrier patterns BP, the bit lines BL and the mask patterns MP may include sequentially forming a conductive layer, a barrier layer, a bit line layer, and the mask patterns MP on the interlayer insulating layer 210, and sequentially patterning the bit line layer, the barrier layer, and the conductive layer by using the mask patterns MP as masks. The conductive layer may fill the first holes TH1 and may be in contact with the first source/drain regions SD1 of the active patterns ACT. The conductive layer may include, for example, a doped semiconductor material. The barrier layer may be formed between the conductive layer and the bit line layer. For example, the barrier layer may include a conductive metal nitride.

A pair of spacers SP may be formed on both side surfaces of each of the conductive pattern CP, the barrier pattern BP, the bit line BL and the mask pattern MP. The formation of the spacers SP may include conformally forming a spacer layer on the substrate 100, and anisotropically etching the spacer layer. The conductive pattern CP, the barrier pattern BP, the bit line BL, the mask pattern MP and the pair of spacers SP may constitute a bit line structure BLS.

An etching process may be performed on the substrate 100 by using the spacers SP and the mask patterns MP as etch masks, thereby forming second holes TH2 exposing the second source/drain regions SD2, respectively. In detail, the second hole TH2 may penetrate the interlayer insulating layer 210 and may extend downward to a lower level than the top surface of the substrate 100. When the second hole TH2 is formed, an upper portion of the second source/drain region SD2 may be recessed. When the second hole TH2 is formed, an upper portion of the device isolation layer ST around the second source/drain region SD2 may be recessed.

A plurality of insulating fences 220 may be formed on the gate capping layer GP. The insulating fences 220 may not overlap with the second holes TH2 but may expose the second holes TH2. Contacts BC may be respectively formed in the second holes TH2 by filling the second holes TH2 with a conductive material. The formation of the contacts BC may include forming a contact layer on an entire top surface of the substrate 100, and recessing the contact layer in such a way that a top surface of the contact layer is lower than top surfaces of the insulating fences 220. The contact layer may be divided by the insulating fences 220, and thus the contacts BC may be formed in the second holes TH2, respectively. The contact layer may include, for example, a doped semiconductor material.

Landing pads LP may be formed on the contacts BC, respectively. The formation of the landing pads LP may include sequentially forming a diffusion barrier layer and a pad layer on the contacts BC and the insulating fences 220, and sequentially patterning the pad layer and the diffusion barrier layer. The pad layer may be patterned to form landing patterns 320, and the diffusion barrier layer may be patterned to form diffusion barrier patterns 310. A first insulating pattern 410 and a second insulating pattern 420 may be formed by sequentially filling a space between the landing pads LP with a first insulating material and a second insulating material.

Bottom electrodes BE may be formed on the landing pads LP, respectively. A dielectric layer DL may be conformally formed on the bottom electrodes BE. A top electrode TE may be formed on the dielectric layer DL. The bottom electrodes BE, the dielectric layer DL and the top electrode TE may constitute data storing elements DS (e.g., capacitors).

According to some example embodiments of the inventive concepts, the hard mask pattern including a different material from that of the first isolation pattern may be used as the etch mask, and thus the etch selectivity may be improved in the etching process of the active pattern and the device isolation layer. More particularly, the etch rate (or an etched degree) of the first isolation pattern may be increased. Thus, a step difference between a center and an edge of a pattern (e.g., the trenches) formed by the etching process may be reduced, inhibited, or prevented, and the line and edge roughness (LER) characteristic may be improved. As a result, the word line formed in the trenches may be formed uniformly and symmetrically. In addition, according to some example embodiments of the inventive concepts, the etch selectivity may be freely adjusted, and thus the filling pattern between the active patterns adjacent to each other may be efficiently etched. As a result, a portion of the word line may be disposed between the active patterns adjacent to each other. Accordingly, the word line may efficiently surround the channel region, and thus the electrical characteristics of the transistor may be improved.

While the inventive concepts have been described with reference to example embodiments, it will be apparent to those skilled in the art that various changes and modifications may be made without departing from the spirits and scopes of the inventive concepts. Therefore, it should be understood that the example embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A semiconductor device, comprising:
    a substrate having one or more inner surfaces defining trenches that define an active pattern of the substrate, the trenches including a first trench and a second trench which have different widths, wherein the substrate has one or more additional inner surfaces that define a third trench penetrating an upper portion of the active pattern;
    a device isolation layer on the substrate such that the device isolation layer at least partially fills the trenches, wherein the device isolation layer includes one or more device isolation layer inner surfaces that define a fourth trench penetrating an upper portion of the device isolation layer at least partially filling the second trench; and
    a word line intersecting the active pattern,
    wherein the device isolation layer includes
        a first isolation pattern covering a portion of the second trench,
        a second isolation pattern on the first isolation pattern and covering a remaining portion of the second trench, and
        a filling pattern filling the first trench under the word line,
    wherein a top surface of the second isolation pattern is located at a higher level than a top surface of the filling pattern,
    wherein the top surface of the second isolation pattern is located at a lower level than a bottom surface of the third trench and at a higher level than a bottom surface of the fourth trench.

2. The semiconductor device of claim 1, wherein the top surface of the second isolation pattern is located at a lower level than a top surface of the active pattern under the word line.

3. The semiconductor device of claim 1, wherein a top surface of the first isolation pattern is located at a lower level than a top surface of the active pattern under the word line.

4. The semiconductor device of claim 1, wherein a top surface of the first isolation pattern is located at a same level as the top surface of the filling pattern.

5. The semiconductor device of claim 1, wherein the top surface of the filling pattern is located at a lower level than a top surface of the first isolation pattern.

6. The semiconductor device of claim 1, wherein
    a curvature of the bottom surface of the third trench is greater than a curvature of the bottom surface of the fourth trench.

7. The semiconductor device of claim 6, wherein the third trench and the fourth trench define a region in which the word line is located.

8. The semiconductor device of claim 1, wherein the first isolation pattern and the second isolation pattern include different materials.

9. The semiconductor device of claim 1, wherein
    the first isolation pattern includes silicon oxide, and
    the second isolation pattern includes silicon nitride.

10. The semiconductor device of claim 1, further comprising:
    a gate dielectric layer between the word line and the active pattern and between the word line and the second isolation pattern.

11. The semiconductor device of claim 1, wherein a width of a bottom surface of the first trench is less than a width of a bottom surface of the second trench.

12. A semiconductor device, comprising:
    a substrate having one or more inner surfaces defining trenches that define an active pattern of the substrate, the trenches including a first trench and a second trench which have different widths;
    a device isolation layer on the substrate such that the device isolation layer at least partially fills the first trench and the second trench;
    a tungsten line intersecting the first trench and the second trench; and
    a copper line intersecting a tungsten line,
    wherein the device isolation layer includes a first isolation pattern covering a portion of the second trench based on contacting the one or more inner surfaces of the substrate defining the second trench, a second isolation pattern on the first isolation pattern and covering a remaining portion of the second trench, and a filling pattern filling the first trench under the tungsten line, wherein a horizontal width of the second isolation pattern is less than twice a horizontal width of the first isolation pattern between the active pattern and the second isolation pattern, wherein a top surface of the filling pattern is located at a lower level than a top surface of the first isolation pattern, wherein the top surface of the first isolation pattern is located at a lower level than a top surface of the second isolation pattern.

13. The semiconductor device of claim 12, further comprising:

a third trench penetrating an upper portion of the active pattern; and a fourth trench penetrating an upper portion of the device isolation layer, wherein the substrate has one or more additional inner surfaces that define the third trench, wherein the device isolation layer includes one or more device isolation layer inner surfaces that define the fourth trench, and wherein a bottom surface of the third trench is located at a higher level than a bottom surface of the fourth trench.

14. The semiconductor device of claim 13, wherein a width of the third trench is equal to a width of the fourth trench.

15. The semiconductor device of claim 12, wherein the filling pattern and the second isolation pattern include different materials.

16. A semiconductor device comprising:

a substrate having one or more inner surfaces defining trenches that define an active pattern, the trenches including a first trench and a second trench, the active pattern including a first source/drain region and a pair of second source/drain regions, the pair of second source/drain regions spaced apart from each other with the first source/drain region between the pair of second source/drain regions;

a device isolation layer on the substrate such that the device isolation layer at least partially fills the first trench and the second trench;

a word line in the substrate and intersecting the active pattern;

a bit line on the substrate and intersecting the word line, the bit line connected to the first source/drain region;

a contact on the substrate and connected to one second source/drain region of the pair of second source/drain regions;

a landing pad on the contact and electrically connected to the contact;

a bottom electrode on the landing pad;

a top electrode on the bottom electrode; and a dielectric layer between the bottom electrode and the top electrode, wherein the device isolation layer includes a first isolation pattern covering a portion of the second trench, a second isolation pattern on the first isolation pattern and covering a remaining portion of the second trench, and a filling pattern filling the first trench under the word line, wherein a top surface of the second isolation pattern is located at a higher level than a top surface of the filling pattern, wherein the substrate has one or more additional inner surfaces that define a third trench penetrating an upper portion of the active pattern, wherein the device isolation layer has one or more device isolation layer inner surfaces that define a fourth trench penetrating an upper portion of the device isolation layer, and wherein a bottom surface of the third trench is located at a higher level than a bottom surface of the fourth trench.

17. The semiconductor device of claim 16, wherein the bit line is a copper line, the word line is a tungsten line, the top surface of the second isolation pattern is located at a lower level than a top surface of the active pattern under the tungsten line, and a top surface of the first isolation pattern is located at a lower level than the top surface of the active pattern under the tungsten line.

18. The semiconductor device of claim 16, wherein the top surface of the filling pattern is located at a lower level than a top surface of the first isolation pattern.

* * * * *